United States Patent [19]

Tsuha et al.

[11] 4,112,429
[45] Sep. 5, 1978

[54] MULTIFUNCTION SEQUENCE OPERATED INTEGRATED SWITCH-DISPLAY DEVICE

[76] Inventors: Wallace K. Tsuha, 36048 Lucerne, Mt. Clemens, Mich. 48043; Timothy R. Schlax, 3150 Bloomcrest, Rochester, Mich. 48063

[21] Appl. No.: 653,793

[22] Filed: Jan. 30, 1976

[51] Int. Cl.² .............................................. G06F 3/14
[52] U.S. Cl. ................... 340/365 R; 340/336; 340/337; 340/365 C
[58] Field of Search ............... 340/336, 365 R, 365 C, 340/324 R, 324 M, 337

[56] References Cited

U.S. PATENT DOCUMENTS

| | | | |
|---|---|---|---|
| 3,670,322 | 6/1972 | Mallebrein | 340/365 C |
| 3,771,156 | 11/1973 | Watts et al. | 340/325 |
| 3,806,911 | 4/1974 | Pripusich | 340/325 |
| 3,848,249 | 11/1974 | Meiri | 340/325 |
| 3,950,743 | 4/1976 | Hatano et al. | 340/336 |

*Primary Examiner*—Marshall M. Curtis
*Attorney, Agent, or Firm*—Krass & Young

[57] ABSTRACT

A contact responsive integrated switching and display system intended as an improvement to electromechanical devices such as rotary switches. The switching device controls the sequencing of displayed characters, by controlling gating of clock pulses into a counter, with activation of a function (such as selection of a circuit) corresponding to a selected displayed character produced by release of the switching device and discontinuance of the sequencing. The switching device is disclosed as physically directly associated or integrated with the display. The switch/display device can be self-contained or can be integrated in a system such as computer-data processing applications. An application of the device to data programming of a computer system is disclosed, in which a multidigit display is interfaced with a computer for operation in computer display, count advance and computer input modes. For each digit of the display, contact with the face of the display element gates clock pulses into a counter. The contents of the counter may be selectively displayed and/or output to the computer by way of a bidirectional data bus. The computer has a digit selection capability. The mode selection switch is implemented as a contact responsive visual display element.

13 Claims, 3 Drawing Figures

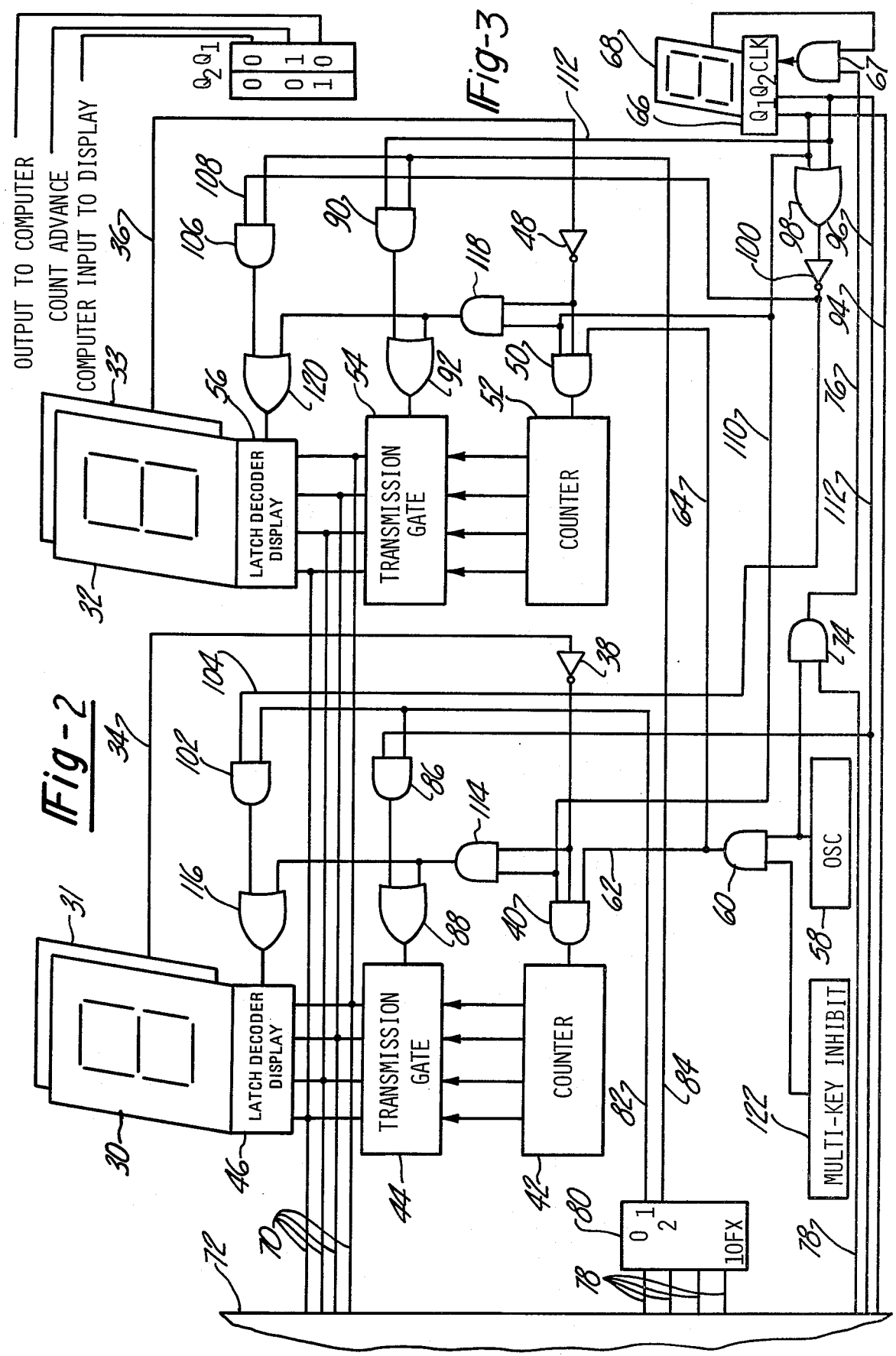

MULTIFUNCTION SEQUENCE OPERATED INTEGRATED SWITCH-DISPLAY DEVICE

INTRODUCTION

This invention relates to devices for selecting and displaying electronically encoded data and entering such data into a processing system or device such as a computer, and particularly to such data selecting and displaying devices wherein the data is programmed, i.e., selected and/or altered, by manual contact with the face of a digital display element.

BACKGROUND OF THE INVENTION

Manually operated rotary switches are commonly used to select and display electronically coded data which is to be input into a computer or other electronic data utilization system. These electromechanical devices may be arranged in a parallel set or sequence to represent the various decimal powers of a digital or numeric quantity selected.

A modern variation on the electromechanical rotary switch is disclosed in the patent to Sottile U.S. Pat. No. 3,851,328 wherein data selection or programming is accomplished by inserting ones finger into an opening in a panel thereby to break a photoelectric connection and gate clock pulses into a counter. The counter, in turn, operates encoder/driver logic to provide a digital display of the segmented numeric type.

However, no prior art device is responsive to manual contact directly with the face of the display element to program new data for display. Contact responsive switches are, of course, well known, but are not shown in the prior art to be combined with a programmable display capability which sequences or alters the selected data at a clock rate simply by maintaining contact with the display face.

BRIEF SUMMARY OF THE INVENTION

According to the present invention a contact responsive integrated switching and display system is provided and is intended as an improvement to electromechanical devices such as rotary switches. The switching device includes means controlling the sequencing of display characters by controlling gating of clock pulses into a counter with activation of a function, such as selection of a circuit corresponding to a selected display character, produced by manual release of the switching device and resultant discontinuance of the sequencing. The switching device is physically integrated with the display. The switch display device can be integrated into a data programming system, such as in conjunction with a computer, and used in conjunction with processing electronic data. In this case the present invention provides a display/selector device for electronic data wherein data is visually displayed by way of a segmented display element or the like and is selected or altered simply by continued manual contact with the face of the display element. This is accomplished by constructing the display element to respond to manual contact, e.g., either by proximity or pressure responsive switch means, to enter clock pulses into a counter, the output of which is applied to an encoder/driver logic unit which controls the display, and to a set of terminals for connection to an external device.

The present invention further provides a multidigit data selection and display system in which each of the various digits is separately programmable by contact response as previously described and further wherein each of several operating modes may be selected. In accordance with the preferred embodiment hereinafter described in greater detail, one selectable mode involves response to data from an external source such as a computer and wherein such data is merely displayed. Another mode involves conditioning the multidigit system for alteration of the data, typically by advancing a numeric count. Another mode involves display and transmission of the data to an external utilization device such as a computer.

It will be understood that while the terms "digit" and "numeric" are used throughout this specification, the invention is not limited to the display of numbers but may be straightforwardly modified to provide for the display of letters and other symbols. The preferred embodiment of the invention will be best understood by a reading of the following description which is to be taken with the accompanying drawings.

BRIEF DESCRIPTION OF THE DRAWINGS

FIG. 3 is a truth table providing an indication of the operation of the mode selection switch.

DETAILED DESCRIPTION OF THE SPECIFIC EMBODIMENT

Figure 1:
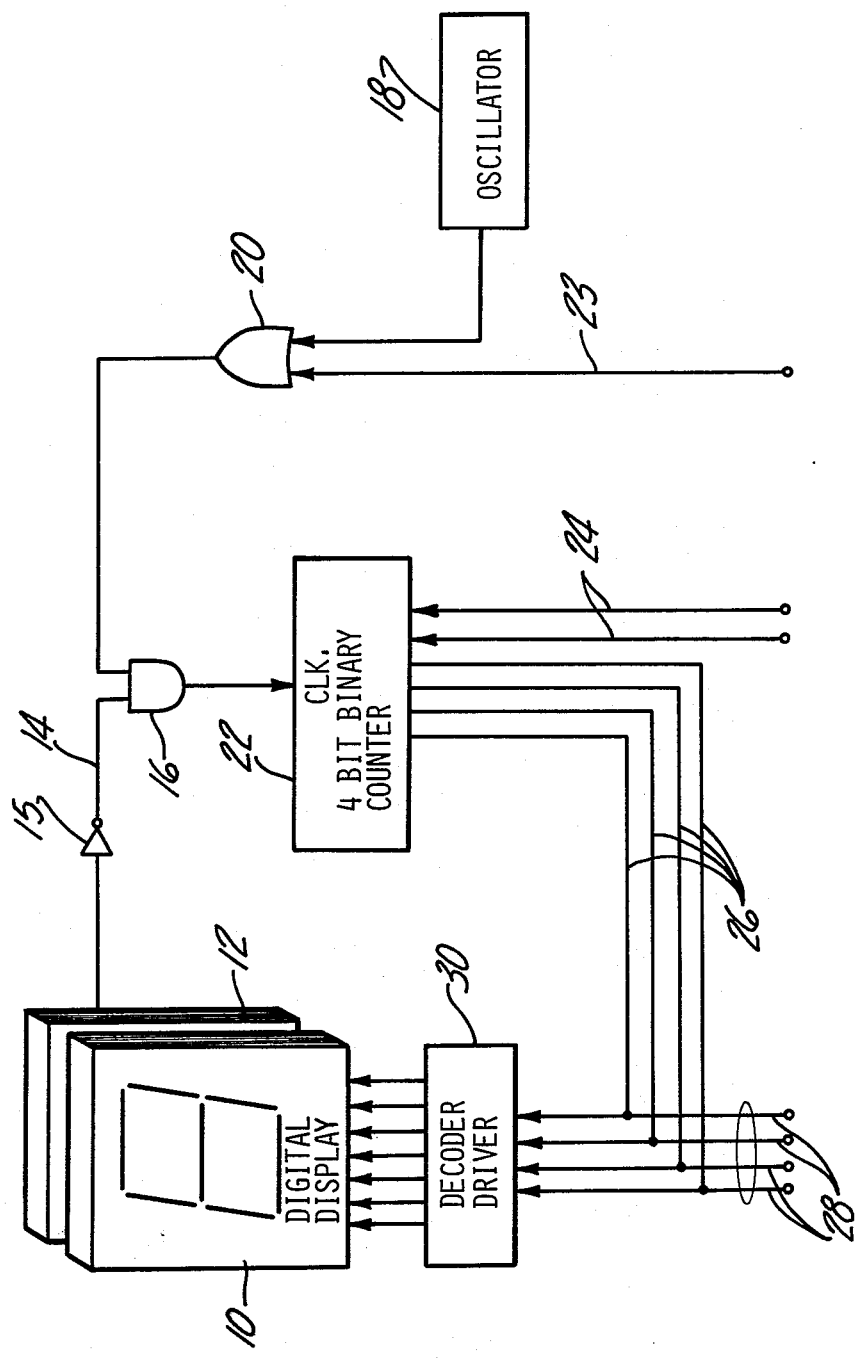
FIG. 1 is a block diagram of a single digit display and selection system embodying the principles of the present invention; and, FIG. 2 is a block diagram, partly in schematic detail, of a multidigit, multimode selection and display system having a two-way data bus connection with an external data processor.

Referring to FIG. 1, a seven segment, single digit, numeric display device 10 is coupled to clock enabling mechanism 12 so as to apply ground or zero potential to line 14 whenever manual pressure is applied to the face of element 10. Line 14 is connected through an inverter 15 to one input of AND gate 16. The other input to AND gate 16 is a slow clock pulse train from oscillator 18, the output of which is connected to OR gate 20. The output of OR gate 20, comprising clock pulses, is applied to the other input of AND gate 16 such that when line 14 is grounded by manual contact pressure on the face of element 10, the clock pulses are input to a four bit binary counter 22. Line 23 connected to the other input of OR gate 20 may provide external clock rate pulses if it is desired to increment the count at some rate other than that provided by oscillator 18. Gate 16 may be eliminated by running the clock pulse line through the switch afforded by mechanism 12; however, this arrangement requires two lines to the display and switch mechanism. Therefore, a simple enable function and gate is preferred.

The four binary bit outputs of counter 22 are connected by way of lines 26 to signal lines 28, one end of each being connected to the inputs of a conventional decoder driver circuit 30. Driver circuit 30 has the seven output signals thereof connected to the digital display element 10 to cause various combinations of the seven display segments to be illuminated to form a numeric digit representing the content of binary counter 22 at any given time. The digit displayed on the face of element 10 continues to sequence or advance at the clock rate as long as manual contact pressure is applied to the face of element 10. A continuous sequence is contemplated; i.e., the digit progresses from 9 to 0 and from 0 to 9 in the normal fashion. The clock rate is preferably selected to provide sufficient reaction time for the removal of pressure upon reaching the selected digit. While a pressure responsive contact switch mechanism 12 is preferred, a proximity responsive switch may also be employed.

Signal transmission lines 28 are provided for communicating the binary count not only to the decoder driver 30 but also to an external data utilization device such as a programmable digital computer. In a given system, the computer may process such data return the same or new data to the display system. Therefore, it is desirable to provide means for responding not only to the contents of counter 22 but also to the data which might be returned to the system from the external data processor.

Such a system is represented in FIG. 2 wherein seven segment digital display elements 30 and 32 are operatively interconnected with clock enabling mechanisms 31 and 33, respectively, so as to respond to manual pressure applied by contact with the face of the display elements to apply ground potential to lines 34 and 36, respectively. Line 34 is connected as an enabling input through inverter 38 to AND gate 40. The output of AND gate 40 is connected to binary counter 42, the outputs of which are connected through a selectively operable transmission gate 44 to a latch, decoder/driver unit 46 for display element 30. Similarly, line 36 is connected through inverter 48 to provide an enabling input to AND gate 50. The output of AND gate 50 is connected to four bit binary counter 52, the outputs of which are connected through a selectively operable transmission gate 54 to the decoder/driver unit 56 for display element 32. Clock pulses to advance the counters 42 and 52 are connected to gates 40 and 50. To this end, oscillator 58 has an output thereof connected through gate 60 and thence to gate 40 by way of line 62 and to gate 50 by way of line 64.

A third signal is applied to each of gates 40 and 50 by way of a mode select unit 66 having its own contact responsive digital display and programming element 68. The three selectable modes are: (1) a computer output/display mode wherein data is received from a computer 72 for display by elements 30 and 32; (2) a count advance mode wherein gates 40 and 50 are enabled so as to receive clocked advance pulses from oscillator 58 whenever contact pressure is applied to one of the faces of elements 30 and 32; and (3) a computer input mode wherein data programmed by way of elements 30 and 32 is input to computer 72 as hereinafter described. The mode is selected by contact pressure on display element 68, such pressure being effective to enable a gate 67 via a contact mechanism as described. When enabled, gate 67 allows clock pulses from oscillator 58 to advance a counter 66. A look-up table of numerical codes for the selectable modes is preferably stationed closely adjacent unit 68. If a computer mode select is preferred, gate 74 may be connected to receive an enabling signal on line 78 from computer 72 and gate 67 may be eliminated along with the switch mechanism associated with element 68. If no such computer control is desired, then gate 74 may act to inhibit gate 67 to prevent a mode change during processing.

The multidigit display system of FIG. 2 is interconnected with a computer 72 by way of a bidirectional data bus 70, the four lines of which are electrically interconnected to the binary counter output lines between the transmission gates and decoder/drivers of both digit displays; i.e., bus 70 has the lines thereof electrically interconnected to the lines between gate 44 and 46 and, in a corresponding pattern, to the lines extending between gate 54 and decoder/driver unit 56. The bidirectionality of lines in the bus 70 is intended to mean that the computer 72 may respond to the data content represented by counters 42 and 52 in a conventional input mode and, in addition, the computer 72 may independently output data to the displays 30 and 32 for display independent of the contents of counters 42 and 52. The fact that several digits are involved indicates the need for individual digit selection for both inputting and outputting purposes.

Digit selection is accomplished by means of the computer 72. Output lines 78 are connected to digit selection decoder 80 having complementally actuated output lines 82 and 84. Line 82 is connected as an enabling signal to AND gate 86, the output of AND gate 86 being connected as an input to OR gate 88. The output of OR gate 88 controls transmission gate 44; more particularly, a high output from gate 88 enables gate 44 to pass signals from counter 42 to unit 46 and to bus 70.

Line 84 is connected as an enabling input to gate 90 and the output of gate 90 is connected as one input to an OR gate 92. The output of OR gate 92 controls the condition of transmission gate 54 such that when the output of gate 92 is high, gate 54 is enabled to transmit the contents of counter 52 to decoder/driver unit 56 and also to bus 70.

It is desirable to control gates 86 and 90 to respond not only to the digit selection effected by the computer 72 but also to the mode selector switch 66, 68. To this end, counter 66 has binary outputs Q1 and Q2 connected to the computer 72 by way of lines 94 and 96, respectively, and also as separate inputs to an OR gate 98. The output of gate 98 is connected through an inverter 100 to gate 102 by way of line 104 and to gate 106 by way of line 108. The Q1 output of clock 66 is also connected by way of line 110 as the final input to both gates 40 and 50. Similarly the Q2 output of counter 66 is connected by way of line 112 as the final input to both gates 86 and 90. From the table of FIG. 2, it is apparent that the counters 42 and 52 may be advanced only when Q1 is high thus enabling gates 40 and 50. Under count advance mode conditions, all three inputs to gates 40 and 50 are high. Under these same circumstances, it is desirable that the contents of counters 42 and 52 be continuously displayed such that while the selected digit is being incremented the programmer may follow the advance by visual observation. To this end, AND gate 114 has the inputs thereof connected to line 110 and the inverted ground line 34, the output of gate 114 being connected to enable the transmission gate through OR gate 88 and to enable the decoder/driver unit 46 through OR gate 116. Similarly, AND gate 118 has inputs connected to corresponding lines and the output connected to enable OR gate 92 which in turn enables transmission gate 54, and OR gate 120 which enables decoder/driver 56. A multikey inhibit function may be provided by unit 122 having an output connected through gate 60 such that the operator may contact one or the other of the display elements 30 and 32 with one hand while contacting the inhibit function key 122 with the other hand. Obviously, other multikey inhibit functions may be provided.

OPERATION

Having described all of the apparatus involved in the system of FIG. 2, a brief description of typical modes of operation will now be made.

In the computer display mode represented by a "00" condition in counter 66, transmission gates 44 and 54 are disabled by low outputs from gates 88 and 92. However, the low output from OR gate 98 is inverted at 100 and applied by way of lines 104 and 108 to enable gates 102 and 106. As the computer selects display element 30, a digit selection signal is applied by way of line 82 to the other input of gate 102 thus providing a high output from gate 102 and enabling the decoder/driver unit 46. A high signal on digit selection line 82 transfers the display to element 30. Because units 46 and 56 are latching devices, it is not necessary to continuously refresh the data to maintain a continuous multidigit display.

Assuming selection of the count advance mode, a high output on Q1 and a low output on Q2 provides enable signals to gates 40 and 50 by way of line 110. A second enabling signal caused by manual contact with the face of one of the display elements 30 and 32, gates clock pulses from oscillator 58 to one of the counters 42 and 52. Transmission gates 44 and 54 are enabled along with decoder driver units 46 and 56 to provide a continuous display of the programmed data.

Assuming a computer output mode is selected, Q2 goes high while Q1 goes low thus disabling the counters as well as the decoder drivers. However, transmission gates 44 and 54 are enabled by high outputs from gates 88 and 92 thus to operatively interconnect the contents of the counter to the data bus 70. The digits, however, are finally selected by means of digit selector 80 by alternately or complementarily actuating lines 82 and 84 as previously described. The truth table at the upper righthand portion of FIG. 2 provides an indication of this operation.

Various modifications and additions to the system of FIG. 2 are possible and will undoubtedly occur to those skilled in the art from a reading of the foregoing specification. Thus, it is to be understood that this description is merely illustrative in character and is not to be construed in a limiting sense. For example, the display may be expanded to three or more digits by straightforward extension of the apparatus. Further, the contact response of the display switches may be implemented in various ways. Although the specific circuitry may be implemented using discrete components, it is preferred to use standard integrated circuit devices. Assuming MOS logic, the following devices may be employed, it being apparent that other unspecified devices such as gates are commonly known:

4-bit binary counter — 93L10
Display, latch & decoder — HP 5082-7300
Transmission gate — CD 4016
1 out of X decoder — CD 4515 B The embodiments of the invention in which an exclusive property or privilege is claimed are defined as follows:

1. A combined display-selector device for electronic data transmission systems comprising:
digital display means responsive to electronic actuation to provide a visual display of a numeric symbol on the face thereof;
switch means physically interconnected with said display means and responsive to manual contact with the face of said display means to assume a condition to pass an electrical signal;
a counter having an input for receiving electrical pulses and outputs for presenting in electrically coded form a signal representing the number of pulses received by said counter;
a pulse source connected to the input of the counter through said switch means whereby manual contact with the display means advances the count;
and means for connecting the outputs of the counter to the display means to advance the numeric display, said means being further adapted for connection to an external device.

2. Apparatus as defined in claim 1 wherein said switch means comprises an AND gate having one input connected to receive the pulses, another input connected to receive an enable signal from the display means when said face is contacted, and an output connected to the input of the counter.

3. Apparatus as defined in claim 1 wherein said switch means includes spaced contacts responsive to manual pressure applied to said face to close and pass an electrical signal therebetween.

4. Apparatus as defined in claim 1 including a bidirectional data bus connected between said counter outputs, said external device and said display means for receiving numeric data from the external device for display and for conveying data being displayed to said external device.

5. Apparatus as defined in claim 4 including selectively enabled gate means connected between said counter outputs and each of said data bus and display means, and mode selector means connected to the gate means for selectively enabling same.

6. Apparatus as defined in claim 5 wherein said mode selector means includes means for simultaneously disabling said counter and said gate means.

7. Apparatus as defined in claim 4 including latch means connected between said data bus and said display means to preserve the display of the last-received data until new data is received.

8. A multidigit data selection and display system comprising:
first and second digital display devices responsive to electronic actuation to provide a visual display of numeric symbols on the faces thereof;
first and second switch means operatively interconnected with the first and second display devices, respectively, for providing respective enabling signals when said faces are manually contacted;
first and second counters each having an input for receiving clock pulses and outputs representing the count therein;
a clock pulse source;
first and second gate means connecting said source to each of the counters and being further respectively connected to receive said enabling signals from the first and second display devices to gate and block the application of clock pulses to the counters according to the presence and absence respectively of said manual contact;
and selectively controllable transmission gates for connecting the counter outputs to the display devices to actuate same for display of the counts.

9. A system as defined in claim 8 further including a data bus commonly connecting an external data source to said display devices, and means for individually selecting said display devices for display of data received from the source via said data bus.

10. A system as defined in claim 8 further including a data bus commonly connecting said display devices to an external data processor, and means for individually selecting said display devices for actuation.

11. A system as defined in claim 10 wherein the means for individual selection of devices comprises digit selector means connected to each of said transmission gates and display devices to select individual digits for simultaneous display and processing of counter contents.

12. A system as defined in claim 11 including mode select means logically interconnected with said means for selecting devices for selectively enabling the transmission gates and digit display devices for data display from counters and/or processor.

13. A multifunction sequence operated integrated switch display device comprising:
   counter means;
   means for sequencing a series of digital signals into said counter means;
   display means producing a sequential character display corresponding to each of said series of digital signals;
   switching means physically integrated with said display means manually operable to control said sequencing of digital signals into said counter means by discontinuing said sequencing upon release of said switching means and retaining the selected digital signal in said counter means and continued display of said character corresponding to said selected digital signal; and,
   means for connecting said counter means to an external device to transmit said selected counter to said device.

* * * * *